US007122084B2

(12) United States Patent
Hohenwarter

(10) Patent No.: US 7,122,084 B2
(45) Date of Patent: Oct. 17, 2006

(54) DEVICE FOR LIQUID TREATMENT OF DISK-SHAPED OBJECTS

(75) Inventor: Karl-Heinz Hohenwarter, Dellach/Gail (AT)

(73) Assignee: SEZ AG, Villach (AT)

( * ) Notice: Subject to any disclaimer, the term of this patent is extended or adjusted under 35 U.S.C. 154(b) by 0 days.

(21) Appl. No.: 10/518,517

(22) PCT Filed: Jun. 18, 2003

(86) PCT No.: PCT/EP03/06441

§ 371 (c)(1),
(2), (4) Date: Dec. 21, 2004

(87) PCT Pub. No.: WO04/001812

PCT Pub. Date: Dec. 31, 2003

(65) Prior Publication Data

US 2005/0223975 A1  Oct. 13, 2005

(30) Foreign Application Priority Data

Jun. 25, 2002 (AT) .................. A 954/2002

(51) Int. Cl.
   *B05B 1/28* (2006.01)
   *B05C 11/02* (2006.01)
   *B08B 3/14* (2006.01)
(52) U.S. Cl. .................. 118/326; 118/52; 118/612; 118/300; 134/148; 134/104.2; 134/183
(58) Field of Classification Search ............ 118/52, 118/612, 319, 320, 326, 300; 396/611, 627, 396/604; 134/148, 104.2, 182, 183, 153, 134/198, 902
See application file for complete search history.

(56) References Cited

U.S. PATENT DOCUMENTS

| 4,889,069 A | 12/1989 | Kawakami |
| 5,013,586 A | 5/1991 | Cavazza |
| 5,209,180 A | 5/1993 | Shoda et al. |
| 5,211,753 A | 5/1993 | Swain |
| 5,415,691 A * | 5/1995 | Fujiyama et al. ............ 118/52 |
| 5,439,519 A | 8/1995 | Sago et al. |
| 5,571,324 A | 11/1996 | Sago et al. |
| 5,584,310 A | 12/1996 | Bergman et al. |
| 5,656,082 A * | 8/1997 | Takatsuki et al. ........... 118/52 |
| 5,906,860 A | 5/1999 | Motoda et al. |
| 6,027,602 A | 2/2000 | Hung et al. .......... 156/345.23 |
| 6,220,771 B1 | 4/2001 | Mahneke et al. .......... 396/611 |
| 6,589,338 B1 * | 7/2003 | Nakamori et al. ........... 118/50 |
| 2002/0195128 A1* | 12/2002 | Shibagaki ................. 134/26 |

FOREIGN PATENT DOCUMENTS

| EP | 0 444 714 | 9/1991 |
| EP | 0753884 A2 | 1/1997 |
| JP | 2002/263554 A2 | 9/2002 |

* cited by examiner

*Primary Examiner*—Chris Fiorilla
*Assistant Examiner*—Yewebdar Tadesse
(74) *Attorney, Agent, or Firm*—Young & Thompson

(57) ABSTRACT

A device is suggested which includes a carrier (1) for receiving the disk-shaped object (10), a liquid supply device (17) for applying liquid onto a disk-shaped object (10) located on the carrier (1), and a liquid catch ring (2), which is positioned essentially coaxially around the carrier (1) and is rotatable around the axis of the liquid catch ring (2).

10 Claims, 2 Drawing Sheets

DEVICE FOR LIQUID TREATMENT OF DISK-SHAPED OBJECTS

Figure 1:
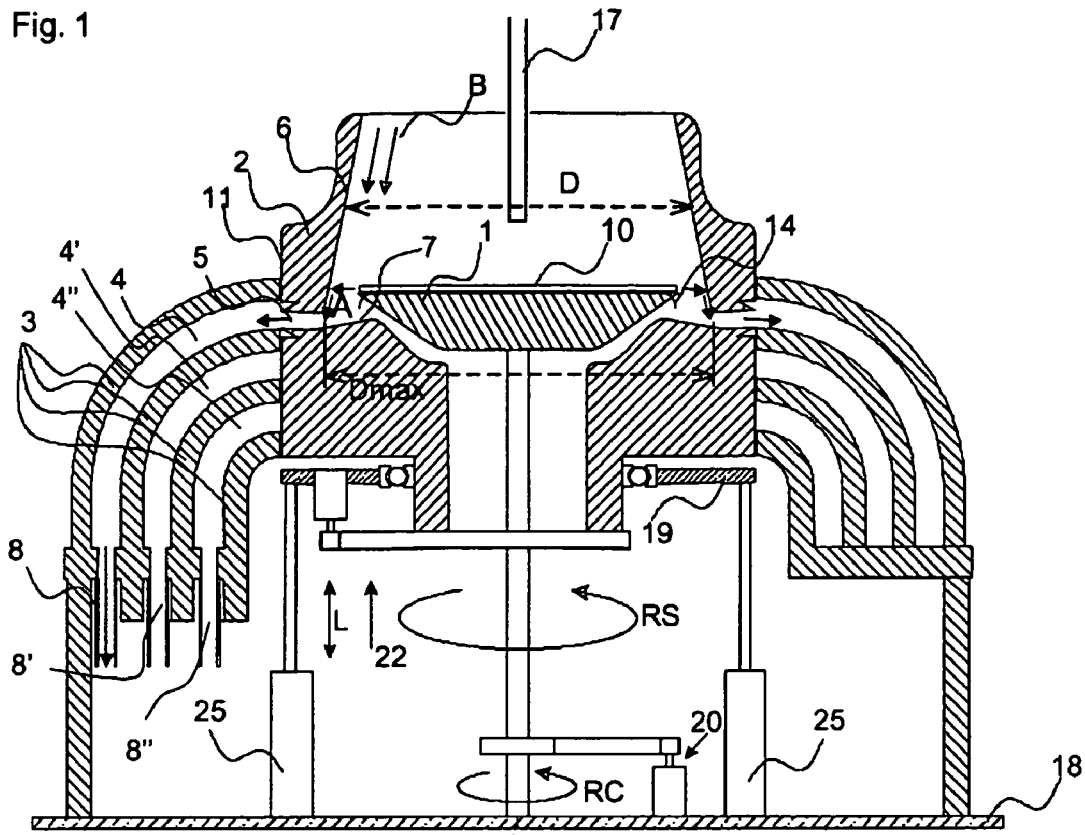

The present invention relates to a device for liquid treatment of a disk-shaped object, particularly a wafer.

When the term wafer is used in the following, it stands for greatly varying types of disk-shaped objects, such as hard disks, CDs, or even substrates for flat-panel displays.

During the liquid treatment, the wafer may either stand still or rotate around its axis.

Devices for liquid treatment of a wafer, in which the wafer is held on a carrier and liquid is applied to the wafer from above or below, are known. The carrier, and with it the wafer, rotates during the liquid application and the liquid is thrown off of the wafer and/or the carrier. Such a device is described in U.S. Pat. No. 4,903,717, for example. The liquid thrown off hits a stationary (not rotating) surface in a chamber, which surrounds the carrier. Sprays arise due to the impact, which may reach the region outside the chamber. However, this is undesirable, since the treatment liquids are often etching media, and therefore liquid sprays may damage machine parts surrounding the chamber or even the wafer to be treated.

In devices for liquid treatment of a wafer, positioning multiple annular chambers one over another and displacing a rotatable carrier vertically, through which different liquids may be caught in different annular chambers and thus separated, collected, and used again, is also known. In this case, liquid sprays are problematic in that the sprays of one liquid may reach the chamber of another liquid, through which this liquid is contaminated.

The object of the present invention is to avoid liquid sprays and to guide the liquid applied to the wafer away from it. A further object of the present invention is to guide liquid applied to the wafer away from it, independently of whether and at what speed the wafer rotates.

Accordingly, the present invention in its most general form suggests a device which includes a carrier for receiving the disk-shaped object, a liquid supply device for applying liquid onto a disk-shaped object located on the carrier, and a liquid catch ring, which is positioned substantially coaxially to the carrier and is rotatable around the axis of the liquid catch ring, the liquid catch ring being movable in relation to the carrier. This relative motion may be an axial displacement or a rotation.

The carrier (chuck) for receiving the disk-shaped object may be a vacuum chuck or a pin chuck, for example. In a vacuum chuck, the wafer is held on the carrier surface by a suction device. In a pin chuck, the wafer is held around its circumference by gripping elements (e.g. pins). These pins may be implemented as rigid or movable (tiltable or pivotable).

The liquid supply device for applying liquid onto a disk-shaped object located on the carrier may be implemented in such a way that the liquid is applied to the surface facing away from the carrier, or even by the carrier, onto the surface facing the carrier.

The liquid catch ring is used for capturing liquid, which runs off or is thrown off a wafer.

An advantage of the device according to the present invention is that liquid which reaches the liquid catch ring from the wafer is held on its inner wall by the rotation of the liquid catch ring and is conveyed further in the axial direction on the inner surface through gravity, centrifugal force, and/or gas flow (air guiding). If the inner surface of the liquid catch ring is a cylindrical shell, the liquid is merely conveyed downward through gravity and/or gas flow and thrown outward at the bottom end of the liquid catch ring. This is in a region below the wafer, through which the probability of contaminating the wafer with liquid, which is thrown off, is reduced.

A further advantage of the device according to the present invention is shown if a rotatable carrier is used. Liquid, which is thrown off of a rotating wafer, may be received softly by a liquid catch ring rotating in the same direction.

With rotatable carriers, a further advantage is achieved if the carrier and liquid catch ring may rotate at different speeds, as it may be necessary, for an optimum process result, to rotate the carrier very slowly or even stop it, while a minimum speed is necessary to throw off liquid.

In one embodiment, the liquid catch ring is rotatable in relation to the carrier. The liquid, catch ring is not directly connected to the carrier and is rotatable independently thereof. This provides the advantage that liquid applied to the wafer is guided away from it independently of whether and at what speed the wafer and/or the carrier rotates.

In a further embodiment, devices are provided for axial displacement of the carrier and liquid catch ring in relation to another.

A device for axial displacement of the carrier and liquid catch ring in relation to one another may move either the carrier or the liquid catch ring, or both the carrier and the liquid catch ring. This possible vertical relative movement of carrier to liquid catch ring provides the possibility of exposing the carrier sufficiently that a wafer may be easily laid on the carrier and removed from the carrier using typical means (robot end effectors). In this case, the possible relative movement of carrier to liquid catch ring provides the additional advantage that different liquids may be collected separately in annular channels attached around the circumference.

In one embodiment, the carrier may be rotatable. This provides the advantage that liquid not only runs off of the wafer or carrier, but is thrown off.

A device in which the diameter of the inner surface of the liquid catch ring varies in the axial direction is advantageous. In this way, liquid may be conveyed through centrifugal force from the smaller diameter of the inner surface to the larger diameter. If the larger diameter is above the smaller diameter, liquid is conveyed upward against the effect of gravity and thrown outward at the upper end of the liquid catch ring, for example.

In one embodiment of the device, in which the liquid catch ring has radial passages, the liquid may be conveyed radially outward.

In a further embodiment, the radial passages are located at the points of the liquid catch ring at which the diameter of the inner surface is the greatest, at least locally. The liquid is conveyed to the regions of the greatest diameter through centrifugal force and then conveyed outward through the passages.

It is advantageous if the inner surface of the liquid catch ring is implemented as conical. This allows the conveyance of the liquid with uniform resultant by the centrifugal force, independently of where the liquid hits the inner surface.

Furthermore, a floor, which rises radially inward, may be shaped onto the lower end of the liquid catch ring in the device according to the present invention. In this way, liquid is collected even better. If the inner diameter of the floor is selected to be smaller than the diameter of the carrier, or the inner diameter of the floor is selected to be smaller than the wafer diameter (if the carrier is smaller than the wafer), then the floor may catch liquid flowing off of the carrier or wafer directly even if the wafer is stationary (not rotating).

In a further embodiment, at least one annular chamber, which is open inward and in which liquid thrown off of the liquid catch ring is collected, is positioned around the liquid catch ring.

This device may also have at least two annular chambers, the openings, which face inward, being positioned one below the other. In this case, devices are provided for axial displacement of the chambers and liquid catch ring in relation to one another. In this way, it becomes possible to collect different liquids in different chambers separately from one another and to remove them separately, or to supply them to the liquid supply device in filtered form, for example.

In an advantageous embodiment, at least a part of the outer surface of the liquid catch ring has the shape of a cylindrical shell. For multiple annular chambers positioned one below another, this allows the annular chambers into which liquid is not currently being thrown to be covered by the cylindrical shell. This covering of the annular chambers may be sealed or even unsealed.

The device may be implemented in such a way that the at least one annular chamber and the carrier are not displaceable in relation to one another in the axial direction. This has the advantage that if the carrier and the annular chamber are positioned directly or indirectly on a shared unit, only the liquid catch ring must be displaced vertically. Carrier and chambers are therefore not moved vertically, which provides the advantage that supply lines to the carrier (for gas and/or liquid) and drain lines from the chambers do not have to be moved, which significantly increases the service life of the lines and also allows the construction of the line guide to be simpler.

Further details, features, and advantages of the present invention result from the following description of the exemplary embodiments of the present invention shown in the drawing.

FIG. 1 shows schematic axial sections of an embodiment of the device according to the present invention.

The device includes a rotatable carrier 1 (chuck), a liquid catch ring 2 positioned around the carrier 1, and a unit of three annular chambers 4, 4', 4", positioned around the liquid catch ring 2. Carrier 1, liquid catch ring 2, and chamber unit 3 are positioned coaxially to one another.

The carrier 1 is mounted rotatably on the baseplate 18 by a bearing unit (not shown). The carrier may be set into rotation RC by the motor-drive unit 20 (using a belt drive here). Typical rotation speeds of the carrier while a wafer is treated are 0 to 4000 rpm (revolutions per minute). A drip edge 14 is shaped around the circumference of the carrier, in order to allow treatment liquid to run off even at low speeds or if the carrier is stationary.

The liquid catch ring 2 is mounted rotatably on an elevating platform 19 and is set into rotation RS by the motor-drive unit 22 (using a belt drive here). Typical rotation speeds of the liquid catch ring while a wafer is treated are 50 to 2000 rpm. The liquid catch ring 2 has a conical inner surface 6, which narrows upward, and an outer surface 11 in the form of a cylindrical shell. At the bottom end of the conical inner surface 6, this inner surface 6 passes into a floor 7. The floor 7 rises slightly toward the center and has an inner diameter, which is smaller than the outer diameter of the carrier 1. The elevating platform 19 is raised and lowered by lifting elements 25 (e.g., pneumatic cylinders). In this way, the relative positions of the liquid catch ring to the carrier and of the liquid catch ring to the annular chambers change in the axial direction.

Radial passages 5 (slots or holes) to the outside are located in the transition of the conical inner surface 6 to the floor 7. The passages are accordingly in a region of the greatest local diameter of the inner surface. Liquid, which is collected by the liquid catch ring, is guided radially outward and thrown off through these passages.

Figure 2:
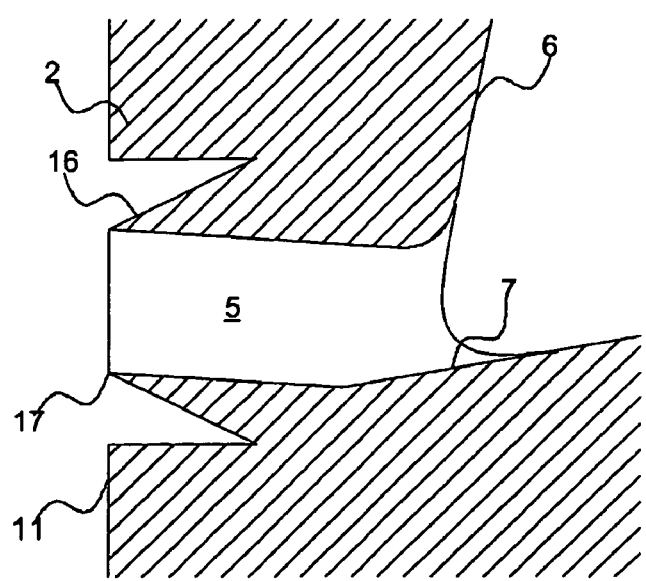

FIG. 2 shows a special embodiment of the passages 5, which allows the liquid to be thrown off more exactly. Grooves 16 are incorporated into the outer surface 11 of the liquid catch ring above and below the passages 5, and breakaway edges 17 thus form directly above and below, adjoining the passages 5. This prevents liquid, which comes out of the passage, from running further upward or downward along the outer surface 11.

At higher speeds of the carrier (above approximately 50 rpm) liquid is thrown directly off of the wafer tangentially, hits the inner surface 6 of the liquid catch ring 2, and runs downward, indicated by the arrow A. At low speeds of the carrier (below approximately 50 rpm) the liquid runs off of the drip edge 14 and is collected by the floor 7 of the liquid catch ring 2. In both cases, the liquid is conveyed in the direction of the passages 5 and through them, supported by the centrifugal force of the rotating liquid catch ring. In order to avoid sprays as much as possible, it is advantageous if the speed of the liquid catch ring is adjusted to the speed of the carrier and/or the liquid thrown off of the wafer. The two rotation directions are to be identical and the speeds are to differ from one another by not more than a factor of 2, and are also not to differ by more than 200 rpm.

The chambers 4, 4', 4" are formed by the rings 3, and are also separated from one another by the rings 3. The rings 3 lie concentrically in and/or over one another and therefore have diameters, which increase from the inside to the outside. The chamber unit is attached to the baseplate 18. A different liquid may be collected in each chamber. Each chamber is emptied by a suction line 8, 8', 8" assigned thereto. Liquid is suctioned off in this case.

Furthermore, the suction line 8, 8', 8" generates an air flow from the mouth radially outward. In this way, air and liquid are suctioned through the passages 5 from the inner chamber of the liquid catch ring 2 into the chamber, through which the throwing off of the liquid is additionally supported. A downward air flow B inside the liquid catch ring 2 is also generated by the suction. The liquid-gas mixture suctioned off is conducted to a gas-liquid separation unit (not shown), the gas being fed to the exhaust air and the separated liquid being guided into the loop or fed to the drain.

FIGS. 3a to 3d schematically show the device in different operating states.

Figure 3A:
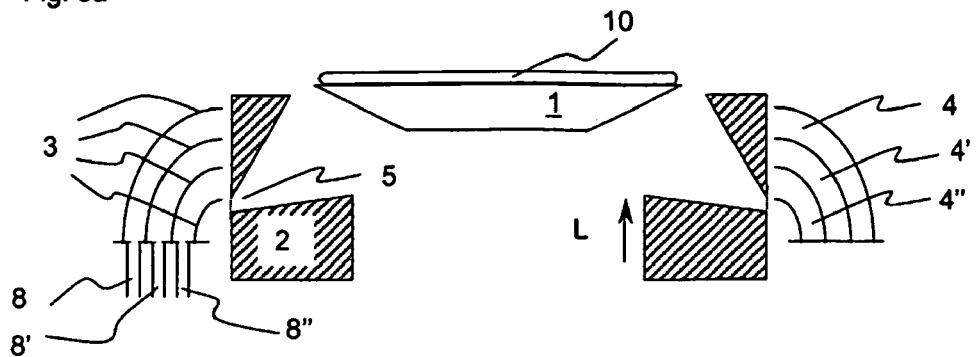

FIG. 3a shows the liquid catch ring 2 in the lowermost position. The wafer is freely accessible around its circumference. This position is selected during loading and unloading.

Figure 3B:
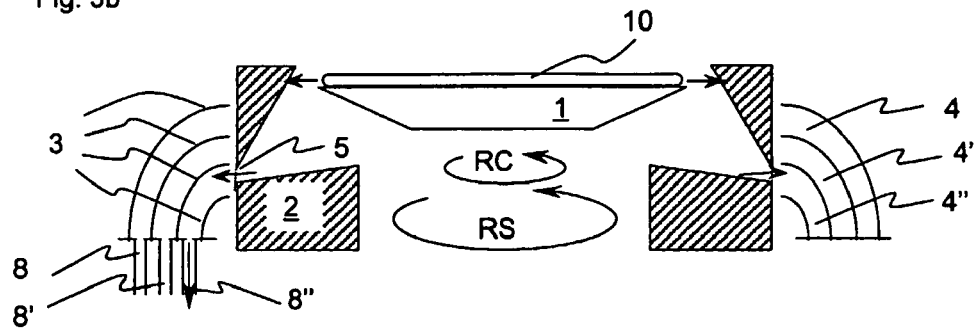
Figure 3C:
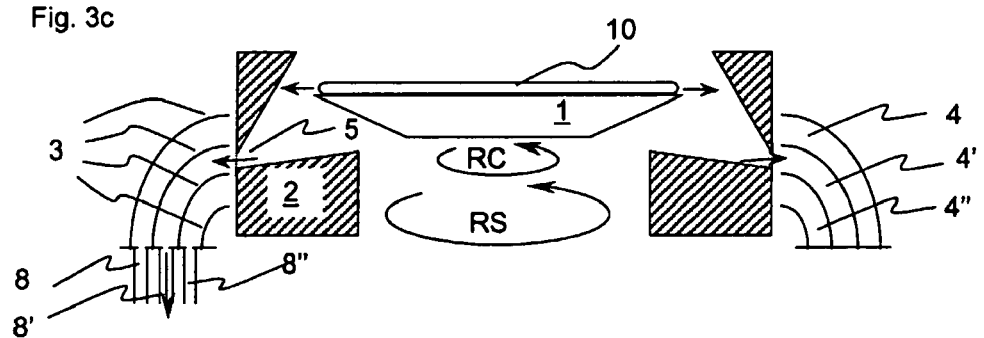
Figure 3D:
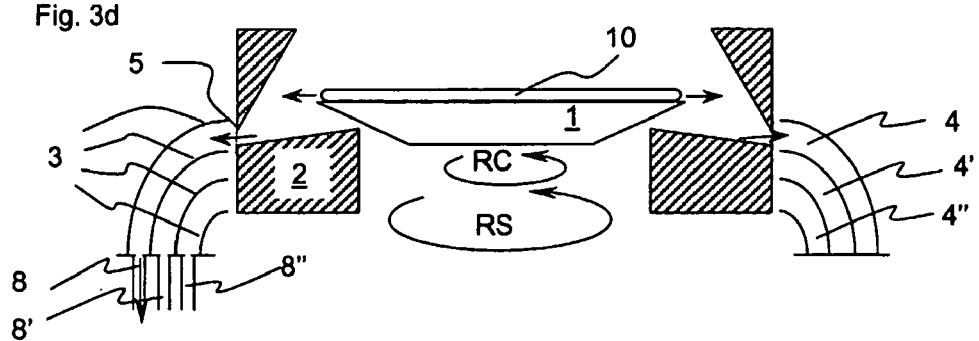

FIGS. 3b to 3d show the liquid catch ring in different positions, the positions each being selected so that the passages 5 point into the openings of the annular chambers 4, 4', and/or 4", which point inward, and therefore liquid is thrown from the liquid catch ring into the corresponding annular chamber. The catching in the corresponding annular chamber is supported in that the corresponding suction line 8, 8", or 8" is activated and air is suctioned only from the annular chamber, which is connected to the selected suction line.

The invention claimed is:

1. A device for treating disk-shaped objects (10) using liquids, including:
   1.1 a carrier (1) for receiving the disk-shaped object;
   1.2 a liquid supply device (17) for applying liquid onto a disk-shaped object located on the carrier; and
   1.3 a liquid catch ring (2), which is positioned substantially coaxially to the carrier (1) and is rotatable around the axis of the liquid catch ring, the liquid catch ring being movable relative to the carrier,
   wherein at least two annular chambers (4, 4'), having openings facing inward and in which liquid thrown off of the liquid catch ring (2) may be collected, are positioned around the liquid catch ring (2), and
   wherein the openings facing inward are positioned one below the other, and devices (25) are provided for axial displacement of chambers (4, 4') and liquid catch ring (2) in relation to one another.

2. The device according to claim 1, wherein at least a part of the outer surface (7) of the liquid catch ring (2) has the shape of a cylindrical sleeve.

3. The device according to claim 1, wherein the at least two annular chambers (4,4') and the carrier (1) are not displaceable in relation to one another in the axial direction.

4. The device according to claim 1, wherein the liquid catch ring is rotatable in relation to the carrier.

5. The device according to claim 1, wherein the carrier (1) is rotatable.

6. The device according to claim 5, wherein the radial passages (5) are located at the points of the liquid catch ring (2) at which the diameter (D) of inner surface (6) is at least locally greatest (Dmax).

7. The device according to claim 1, wherein the diameter (D) of the inner surface (6) of the liquid catch ring (2) varies in the axial direction.

8. The device according to claim 7, wherein the inner surface (6) of the liquid catch ring (2) is implemented as conical.

9. The device according to claim 7, wherein a floor (7), which rises radially inward, is shaped onto the bottom end of the liquid catch ring (2).

10. The device according to claim 1, wherein the liquid catch ring (2) has radial passages (5), through which the liquid may be conveyed radially outward.

* * * * *